United States Patent
Locasio et al.

(10) Patent No.: US 8,874,834 B2
(45) Date of Patent: *Oct. 28, 2014

(54) TRACKING A LIFETIME OF WRITE OPERATIONS TO A NON-VOLATILE MEMORY STORAGE

(71) Applicant: Intel Corporation, Santa Clara, CA (US)

(72) Inventors: Victor W. Locasio, Folsom, CA (US); Steven E. Wells, El Dorado Hills, CA (US); Will Akin, Morgan Hill, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/038,728

(22) Filed: Sep. 26, 2013

(65) Prior Publication Data

US 2014/0101374 A1   Apr. 10, 2014

Related U.S. Application Data

(63) Continuation of application No. 12/462,721, filed on Aug. 7, 2009, now Pat. No. 8,566,506.

(51) Int. Cl.
*G06F 12/00* (2006.01)
*G06F 12/02* (2006.01)
*G11C 16/34* (2006.01)
*G06F 11/30* (2006.01)

(52) U.S. Cl.
CPC ........ *G06F 12/0246* (2013.01); *G06F 11/3037* (2013.01); *G06F 11/3055* (2013.01); *G06F 2212/7204* (2013.01); *G11C 16/349* (2013.01)
USPC .................................. 711/103; 711/E12.069

(58) Field of Classification Search
USPC ......................................................... 711/103
See application file for complete search history.

(56) References Cited

U.S. PATENT DOCUMENTS

| | | | | |
|---|---|---|---|---|
| 7,882,313 | B2 * | 2/2011 | Rikitake | 711/156 |
| 7,979,636 | B2 * | 7/2011 | Ito | 711/115 |
| 2007/0186061 | A1 * | 8/2007 | Oh et al. | 711/154 |

* cited by examiner

*Primary Examiner* — Reginald Bragdon
*Assistant Examiner* — Hamdy S Ahmed
(74) *Attorney, Agent, or Firm* — Kacvinsky Daisak Bluni PLLC

(57) ABSTRACT

A method, device, and system are disclosed. In one embodiment method begins by incrementing a count of a total number of write operations to a non-volatile memory storage for each write operation to the non-volatile memory storage. The method then receives a request for the total count of lifetime write operations from a requestor. Finally, the method sends the total count of lifetime write operations to the requestor.

22 Claims, 4 Drawing Sheets

TRACKING A LIFETIME OF WRITE OPERATIONS TO A NON-VOLATILE MEMORY STORAGE

CROSS-REFERENCE OF RELATED APPLICATIONS

This application is a continuation of, claims the benefit of and priority to, previously filed U.S. patent application Ser. No. 12/462,721 entitled "TRACKING A LIFETIME OF WRITE OPERATIONS TO A NON-VOLATILE MEMORY STORAGE" filed on Aug. 7, 2009, the subject matter of which is hereby incorporated by reference in its entirety.

FIELD OF THE INVENTION

The invention relates to non-volatile memory storage systems. More specifically, the invention relates to tracking write operations to a non-volatile memory storage.

BACKGROUND OF THE INVENTION

Non-volatile memory (NVM) storage is very popular in the computer industry and the electronics industry. Computers have long utilized NVM storage for basic input/output system (BIOS) code storage and other important boot routines. But, more recently, the usage models for NVM storage have expanded greatly from digital camera image storage to digital music player storage of songs. NVM devices have dramatically decreased in size and increased in storage capacity. Now the computer industry is beginning to build solid state drives (SSDs) utilizing NVM devices for mass storage. SSDs may someday completely replace conventional hard disk drives due to in part to superior performance, smaller profiles, and lower power requirements.

One long known detriment to NVM devices has been their finite lifespan. Unlike their volatile memory counterparts, the circuitry within NVM devices deteriorate from write operations. Eventually, with enough write operations to an NVM device, that device may become unreliable.

BRIEF DESCRIPTION OF THE DRAWINGS

The present invention is illustrated by way of example and is not limited by the drawings, in which like references indicate similar elements, and in which.

DETAILED DESCRIPTION OF THE INVENTION

Figure 1:
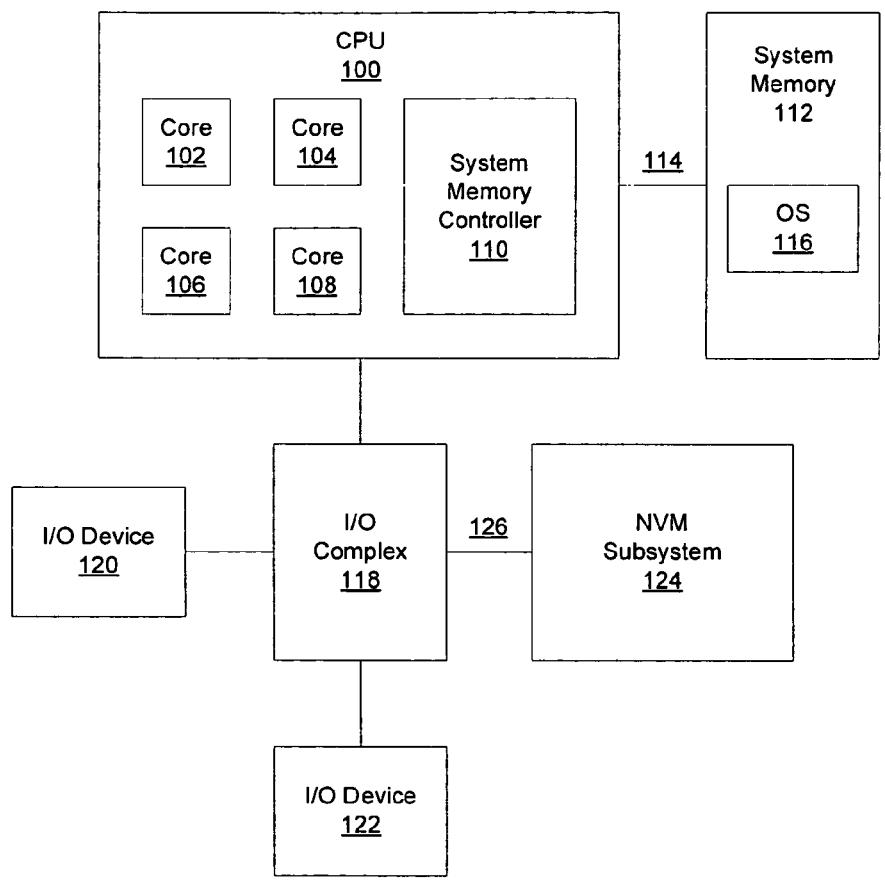
FIG. 1 illustrates an embodiment of a computer system including a non-volatile memory storage system.

Embodiments of a method, device, and system, to maintain a lifetime count of write operations to a non-volatile memory storage array are described.

A computer system may include a non-volatile memory (NVM) storage subsystem. In many embodiments, the NVM storage subsystem may be a solid state drive (SSD). In other embodiments, the NVM storage subsystem may be utilized for a different purpose than a general purpose storage drive. The NVM storage subsystem includes one or more NVM devices. For example, there may be several NAND flash memory devices that create a storage array within the NVM storage subsystem. The nature of NVM devices causes them to have a relatively known lifespan. The lifespan consists of a certain number of writes to each NVM device. Beyond this predetermined number of writes, the reliability of an NVM device declines. Eventually NVM devices wear out and cease to reliably store data.

Thus, the computer system with the NVM storage subsystem may include logic to maintain an accumulated number of lifetime writes to the NVM array. This lifetime write count would essentially be able to tell any inquirer how "young" or "old" the NVM storage array currently is. Logic within a controller in the NVM subsystem may constantly increment a lifetime write count for each write performed on the array. When the computer system containing the NVM storage subsystem is operational, the lifetime write count may be maintained in a register or other volatile memory location. When the computer system prepares to power down, reboot, reset, or otherwise become non-operational and potentially lose power, logic within the controller may store the current lifetime write count in the NVM array. Then when the computer system boots again, the logic may read lifetime write count from the NVM array and restore it within the volatile memory location for further use.

Reference in the following description and claims to "one embodiment" or "an embodiment" of the disclosed techniques means that a particular feature, structure, or characteristic described in connection with the embodiment is included in at least one embodiment of the disclosed techniques. Thus, the appearances of the phrase "in one embodiment" appearing in various places throughout the specification are not necessarily all referring to the same embodiment.

In the following description and claims, the terms "include" and "comprise," along with their derivatives, may be used, and are intended to be treated as synonyms for each other. In addition, in the following description and claims, the terms "coupled" and "connected," along with their derivatives may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate, interact, or communicate with each other.

FIG. 1 illustrates an embodiment of a computer system including a non-volatile memory storage system.

The computer system includes one or more central processing units (CPUs), such as CPU 100. In many embodiments, CPU 100 is an Intel® Corporation CPU. In other embodiments, CPU 100 is another brand CPU. CPU 100 includes one or more processor cores, such as cores 102, 104, 106, and 108. Each core includes one or more execution units, retirement units, a number of storage registers, potentially one or more cache memories, as well as other circuitry that generally resides within a CPU core. CPU 100 also may include a system memory controller 110 to control communication with a system memory 112. A system memory interconnect 114 communicatively couples the system memory 112 with CPU 100. The interconnect may include lines to transport address, data, control and clock information between CPU 100 and system memory 112. Although system memory controller 110 resides within CPU 100 in FIG. 1, in other embodiments that are not shown, system memory controller 110 may reside in a separate integrated circuit, discrete from CPU 100, in the computer system.

System memory 112 may be a dynamic random access memory (DRAM) in many embodiments. For example, system memory 112 may be a form of double data rate (DDR) synchronous DRAM. In other embodiments, system memory may be another form of memory, such as a non-volatile memory. System memory 110 may store instructions and data to be executed by the CPU 100. For example, system memory 110 may store an operating system (OS) 116 during the operation of the computer system.

In many embodiments, CPU 100 is communicatively coupled to an I/O (input/output) complex 118. The I/O complex 118 may include one or more I/O controllers (not shown) that allow the computer system to communicate with one or more I/O devices (such as devices 120 and 122). For example, I/O complex 118 might include a universal serial bus (USB) controller and I/O devices 120 and 122 may be USB devices.

In many embodiments, the I/O complex 118 is also coupled to a non-volatile memory (NVM) subsystem 124. The NVM subsystem 124 includes at least one or more non-volatile memory devices. In different embodiments, the NVM devices may include certain types of flash memory such as NAND and NOR-based devices, phase change memory (PCM), electrically erasable programmable read only memory (EEPROM), or one or more other types of NVM. The NVM devices may store data that is not contingent upon power being supplied to the NVM subsystem. Thus, during computer system reset sequences, power down and up sequences, as well as any other sequence that may cycle the power to the computer system, the NVM subsystem can continue to store data in the one or more devices. This is opposed to the system memory 112, which requires power to store data. Any data stored in the system memory 112 during a reset or power cycling sequence would be lost if not saved elsewhere during the sequence. In many embodiments, the NVM subsystem 124 comprises a solid-state drive (SSD).

The NVM subsystem 124 is communicatively coupled to the computer system by way of an interconnect 126. Interconnect 126 comprises one or more lines that are utilized to transmit data, address, control, and other signals. In some embodiments, the lines may comprise copper wires. In other embodiments, the lines may comprise another metal or alloy, optical lines, or another medium utilized to transmit information.

In many embodiments, interconnect 126 communicatively couples the NVM subsystem 124 with the I/O complex (component 118 in FIG. 1). However, in other embodiments, interconnect 126 may communicatively couple the NVM subsystem 124 with another integrated circuit component within the computer system.

Figure 2:
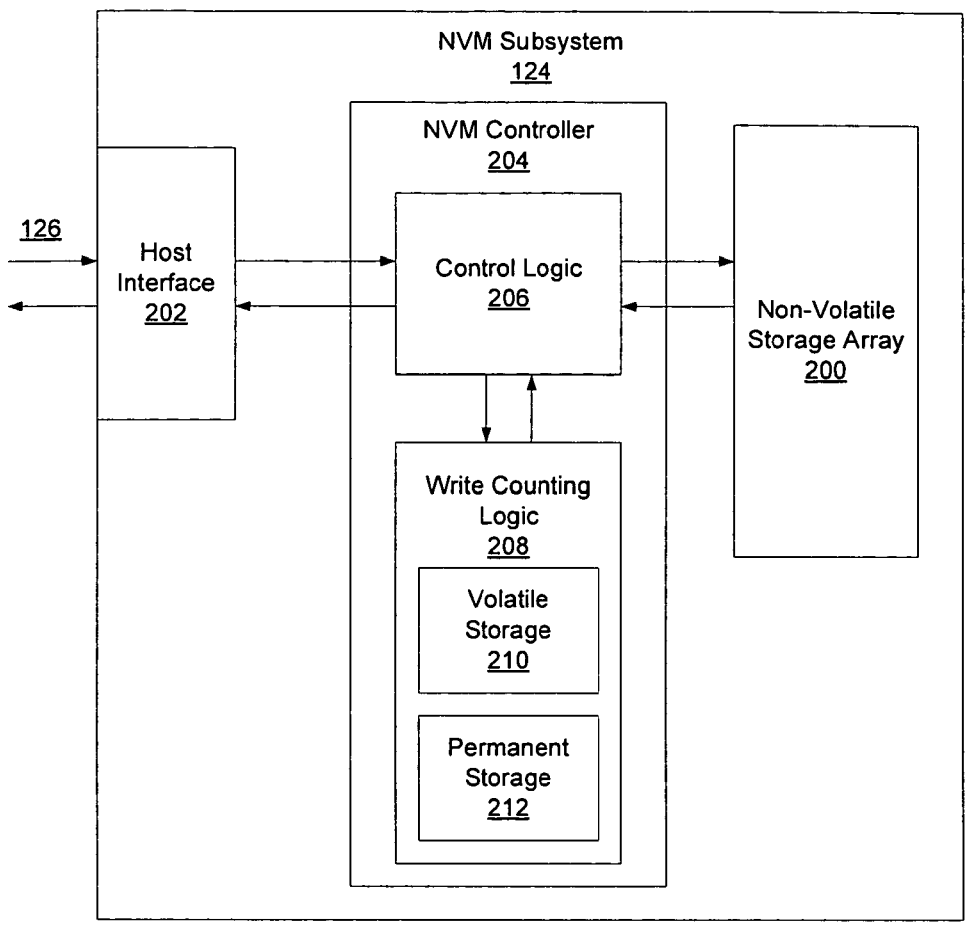
FIG. 2 illustrates a detailed view of an embodiment of the NVM subsystem.

FIG. 2 illustrates a detailed view of an embodiment of the NVM subsystem.

The NVM subsystem includes non-volatile storage array 200. In different embodiments, the storage may be flash memory or another form of memory storage that is non-volatile. For example, the storage may comprise one or more NAND devices. In other embodiments, the non-volatile storage array 200 may comprise NOR devices, PCM, an EEPROM, or another type of NVM. In many embodiments, the non-volatile storage array includes one or more NVM devices and the devices are each sub-divided into a number of sectors.

The NVM subsystem 124 includes a host interface 202. The host interface 202 is the communication interface between the NVM subsystem 124 and the remainder of the computer system. For example, communication between a host CPU, such as CPU 100 in FIG. 1, and the NVM subsystem 124 may take place through the host interface 202. Read and write requests from CPU 100 may be routed through the host interface 202 into the NVM subsystem 124. In many embodiments, the host interface 202 includes one or more buffers that can store several read and write requests entering the NVM subsystem 124. The buffers may be in the form of queues, such as first-in first-out (FIFO) queues, which may store requests that enter the NVM subsystem 124.

The host interface 202 may receive host requests, such as read and write requests, and then forward them to an NVM controller 204. Control logic 206 within the NVM controller 204 may process the requests and write to or read from the non-volatile storage array 200.

Non-volatile storage array 200 has a finite lifespan due to write wearing of the NVM storage devices that comprise the array. When data is written to an NVM device within non-volatile storage array 200, the process of writing to one or more of the sectors that make up the storage will eventually create wear effects in those sectors. Specifically, when a write request is processed by control logic 206, the control logic erases data within one or more sectors in the array and then writes in the new data to complete the write process. The erase procedure in NVM memories is the specific portion of the write process that causes the device media to wear. In many embodiments, algorithms are implemented by control logic 206 to evenly distribute the wear across all sectors of all devices in the non-volatile storage array. Though, NVM devices come with a certain fairly predictable lifespan. Thus, many NVM device manufacturers estimate the total number of writes available for a given device before it wears out to the point of unreliability.

In many embodiments, the NVM controller 204 includes write counting logic 208 that may keep a count of the number of writes to the storage array 200. The count can include all writes to the array over the lifetime of the array. So, for example, each time the computer system powers up and is operational, the write counting logic continues to increment this lifetime write count to the array. In many embodiments, a register or other form of volatile storage 210 is located in the NVM controller to keep the lifetime write count to the storage array 200.

When the computer system is powered off, the lifetime write count to the storage array 200 may be stored within the storage array 200 itself. Because of the NVM nature of the storage array 200, the count can be saved through cycling of the computer system's power and through reset sequences. When the computer system powers up or comes out of a reset, control logic 206 may read the stored lifetime write count stored within the storage array 200 and place the current count value into the volatile storage 210 location within the NVM controller 204. In other embodiments that are not shown, the volatile storage location may be external to the NVM controller 204.

Once the lifetime write count has been placed into the volatile storage 210 location, control logic 206 may inform write counting logic 208 to increment the count for each write performed in the storage array 200. At a certain time when the computer system is about to perform a reset or power down, the lifetime write count being incremented in the volatile storage 210 can be written by control logic 206 into a location within the storage array 200. This allows the lifetime write count to be maintained while the computer system resets, is powered down, or is otherwise non-operational. The same restore procedure is then performed to pull the lifetime write count out of the storage array 200 and stored back into the volatile storage 210 for further increment procedures during each write.

In some embodiments, there is a backup procedure that takes place after a certain period of time to store a recent lifetime write count to the storage array 200 during computer system operation. This may be more beneficial with computer systems that stay operational for days, or weeks, or months at a time between power cycles or resets. In case a catastrophic failure happens with the computer system and the system instantly loses power, if a backup count is maintained by writing a new count every certain number of minutes, or hours, or days into the storage array 200, then when the computer system recovers after the failure, a more recent lifetime write count may be restored.

In many embodiments, the writes that are counted may be limited to host writes. In other words, write requests received across interconnect 126 through the host interface 202 are counted but other writes may not be counted. In other embodiments, all writes to the storage array 200 are counted. For example, control logic 206 may perform a number of writes to the storage array 200 for desegmentation purposes. Host writes sent to random locations within the storage array 200 may eventually lead to fragmentation of data stored within the storage array 200. There is a requirement to desegment the valid stored data to create contiguous segments of storage that contain no valid data so that they may be erased. When there is a need to erase a segment of the storage array and there is some valid data in the segment, control logic 206 is required to move (write) the valid data already stored into another segment. Thus, the host write would have to be accompanied by another write to reposition the older data into a different segment with storage space.

The types of operations explained above require additional writes to the storage array 200 apart from host writes. Thus, in many embodiments, these additional non-host writes (e.g. initiated not by the host but by the control logic 206) are counted as a part of the total lifetime write count that is maintained. In any event, whether the lifetime write count includes simply host writes or host writes plus non-host writes, for each write operation that is counted, the control logic 206 will inform the write counting logic 208 to increment the lifetime write count stored within volatile storage 210.

In many embodiments, apart from read requests and write requests received from the host at the host interface 202, there may be a lifetime write count request received at the host interface 202. A host CPU or another device, such as a management controller, may request the current lifetime write count to the non-volatile storage array. When a lifetime write count request is received by the host interface 202, the interface may forward the request to the control logic 206. The control logic then may send the current lifetime write count value, stored in the volatile storage 210, in a response back to the host interface 202 to be routed to the requestor.

In some embodiments, a permanent storage 212 may be present. In different embodiments, the permanent storage 212 may be located within write counting logic 208 (pictured), within control logic 206, elsewhere within NVM controller 204, elsewhere within the NVM subsystem 124, or elsewhere within the computer system in general. The permanent storage 212 may be a write once register or another type of permanent storage device. The permanent storage 212 may store a total predicted lifetime write count which can equal the total number of writes to the NVM storage array before the NVM devices within the array would be predicted to become unreliable. For example, the permanent storage 212 may store a value such as $1 \times 10^{15}$, which would indicate that the life expectancy of the NVM subsystem 124 prior to a failure may allow for $1 \times 10^{15}$ total writes to the array.

Thus, a requestor may request a value other than simply the current lifetime write count value stored in a location in the volatile storage 210. Rather, the requestor may request a remaining number of lifetime writes available for the NVM subsystem 124 prior to a predicted failure. Prediction logic, which may be located within control logic 206 or elsewhere in the computer system, may receive such a request and return the result by subtracting the current lifetime write count value (stored in the volatile storage 210) from the total predicted lifetime write count value (stored in the permanent storage 212). In other embodiments, these two values may also allow logic to report information to a requestor in the form of a percentage. For example, by using the same two values discussed above (i.e. current lifetime write count (CLWC) and total predicted lifetime write count (TPLWC)), the predicted percentage of life remaining for the NVM subsystem 124 may be reported. In some embodiments, such a result may be determined using the following equation:

$$\text{Predicted\_Percentage\_of\_Life\_Remaining} = \frac{(TPLWC - CLWC)}{TPLWC}$$

In other embodiments, another equation may be utilized to predict a similar value. In many embodiments, the total predicted lifetime write count may be predetermined by the manufacturer of the NVM subsystem 124 based on a characterization of the underlying NVM storage array 200 technology. For example, the manufacturer may stress test several sample NVM storage arrays to see after how many writes each array fails and then make a determination as to the predicted value from the results of the tests.

In other embodiments, additional forecasting of the lifespan of the NVM subsystem 124 may be utilized. For example, logic within the NVM subsystem 124 may also track a time element to provide a time-based prediction as to the end of life of the NVM storage array 200 (i.e. when NVM storage array 200 hardware begins to fail). A time element may comprise a time of day and a date.

At any given point in time, the current time of day and date may be retrieved. In many embodiments, the NVM subsystem 124 maintains its own time. The time from when the NVM subsystem is powered on the first time until the current time is the lifetime of the subsystem in days, hours, minutes, etc. This time may or may not reflect accurately the time that has passed in real time. In some embodiments, the NVM subsystem 124 is located within an enterprise server that is always on and thus the delta in time between the beginning time of the NVM subsystem 124 and the current time may fairly accurately reflect real time. In other embodiments, the NVM subsystem 124 is in a personal computer that may be powered down more often than operational and thus the lifetime delta in time does not accurately reflect real time. Regardless, the time that the NVM subsystem 124 keeps accurately reflects the relative age of the NVM subsystem 124 in working hours.

When the NVM subsystem 124 boots for the first time the current date and time (i.e. start time (ST)) may be stored in a location in permanent storage 212. Then, at a future point in time, a request for the predicted amount of life left in the NVM subsystem may be received. When the request is received, prediction logic may determine the current date/time (i.e. current time (CT)). In some embodiments, a predicted amount of time remaining in the lifespan of the NVM subsystem 124 may be determined using the following equation:

$$\text{Predicted\_Remaining\_Lifespan} = \frac{TPLWC}{CLWC}(CT - ST)$$

In other embodiments, another equation may be utilized to predict a similar value. This predicted remaining lifespan takes the rate at which writes have been occurring to the NVM subsystem 124 from the beginning of life (i.e. start of usage at ST) of the NVM storage array 200 to the current time (CT) and then utilizes that rate to project the remaining lifespan of the array in terms of time. The predicted remaining lifespan may be reported back to the requestor in years, months, days, hours, etc.

In further embodiments, based on the results of the remaining predicted lifespan, control logic 206 may modify the policies of the NVM subsystem 124 to attempt to lengthen the lifespan past the predicted end date.

For example, a wear-leveling algorithm, designed to distribute writes equally among all NVM devices in the NVM storage array 200, may activate or become more aggressive as wear approaches a wear threshold write count value. This threshold value may be a percentage of the total predicted lifetime write count or a specific count value. The threshold value may also reside in permanent storage 212 and once the current lifetime write count surpasses the threshold, the wear-leveling algorithm may be engaged or modified. In many embodiments, wear-leveling is unnecessary early in the wear lifetime of the NVM subsystem 124 because few, if any NVM devices in the NVM storage array 200 will be near their rated maximum cycles and unnecessary wear-leveling will increase wear (since wear-leveling requires re-writing data).

In other embodiments, if the total predicted lifetime write count is approaching at a faster rate than what is otherwise desirable, the control logic 206 may begin to throttle host writes in order to slow the rate of writes (and thus wear). The throttling may extend the forecasted end-of-life time to match the desired lifetime.

In yet other embodiments, a refresh cycle for the NVM device(s) in the NVM storage array 200 may activate or become more frequent as wear of the NVM storage array reaches or approaches a threshold. A refresh for a NVM device in the array can be triggered on either a predetermined number of block reads or an elapsed time since the last write to a block. The frequency of refresh required to require the NVM storage array 200 to be effective increases with wear on the device(s) comprising the array.

Figure 3:
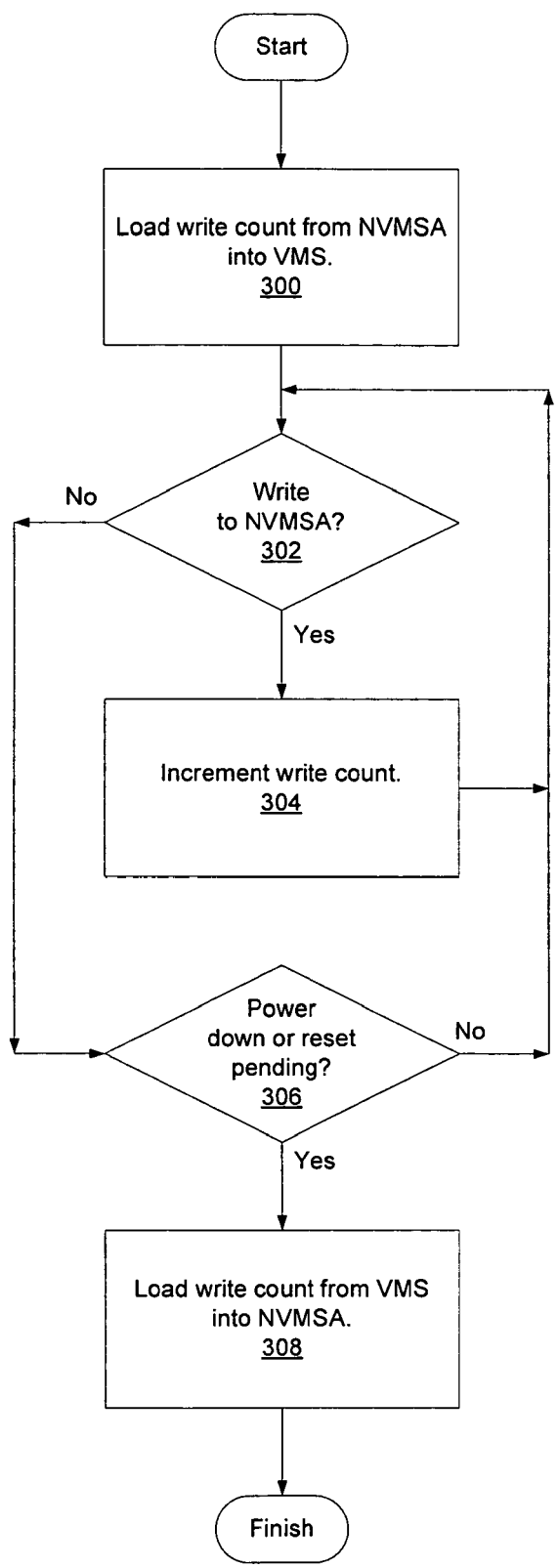
FIG. 3 is a flow diagram of an embodiment of a process to count the lifetime write count to a non-volatile memory storage array.

FIG. 3 is a flow diagram of an embodiment of a process to count the lifetime write count to a non-volatile memory storage array.

The process is performed by processing logic, which may comprise hardware or software or both. The process conducts a lifetime write count of a non-volatile memory storage array (NVMSA) in a computer system. The process shown specifically in FIG. 3 comprises the process performed when the computer system is operational between two resets, power cycles, reboots, etc. This process may be repeated for each subsequent reboot, reset, etc.

The process begins by processing logic loading a write count from the NVMSA into a volatile memory storage (VMS) (processing block 300). For example, this load portion of the process may take place during the boot sequence of the computer system that the NVM subsystem resides within.

Once the lifetime write count is loaded into the VMS, then processing logic determines whether there is a write to the NVMSA (processing block 302). If a write has taken place, then processing logic increments the write count (processing block 304). As discussed above, depending on the implementation, the type of write that would cause an increment to the count may be limited to host writes or may include host writes as well as non-host writes, in different embodiments. Once the increment processing block has been completed, then processing logic returns to processing block 302 to check for another write.

Otherwise, if a write has not taken place, then processing logic determines whether a power down or reset is pending (processing block 306). If no power down or reset is pending, then processing logic returns to processing block 302 to check for another write. Alternatively, if a power down or reset is pending for the computer system, then processing logic loads the write count from the VMS back into the NVMSA for storage during the reboot, reset, power cycle, etc. (processing block 308) and the process is finished.

Figure 4:
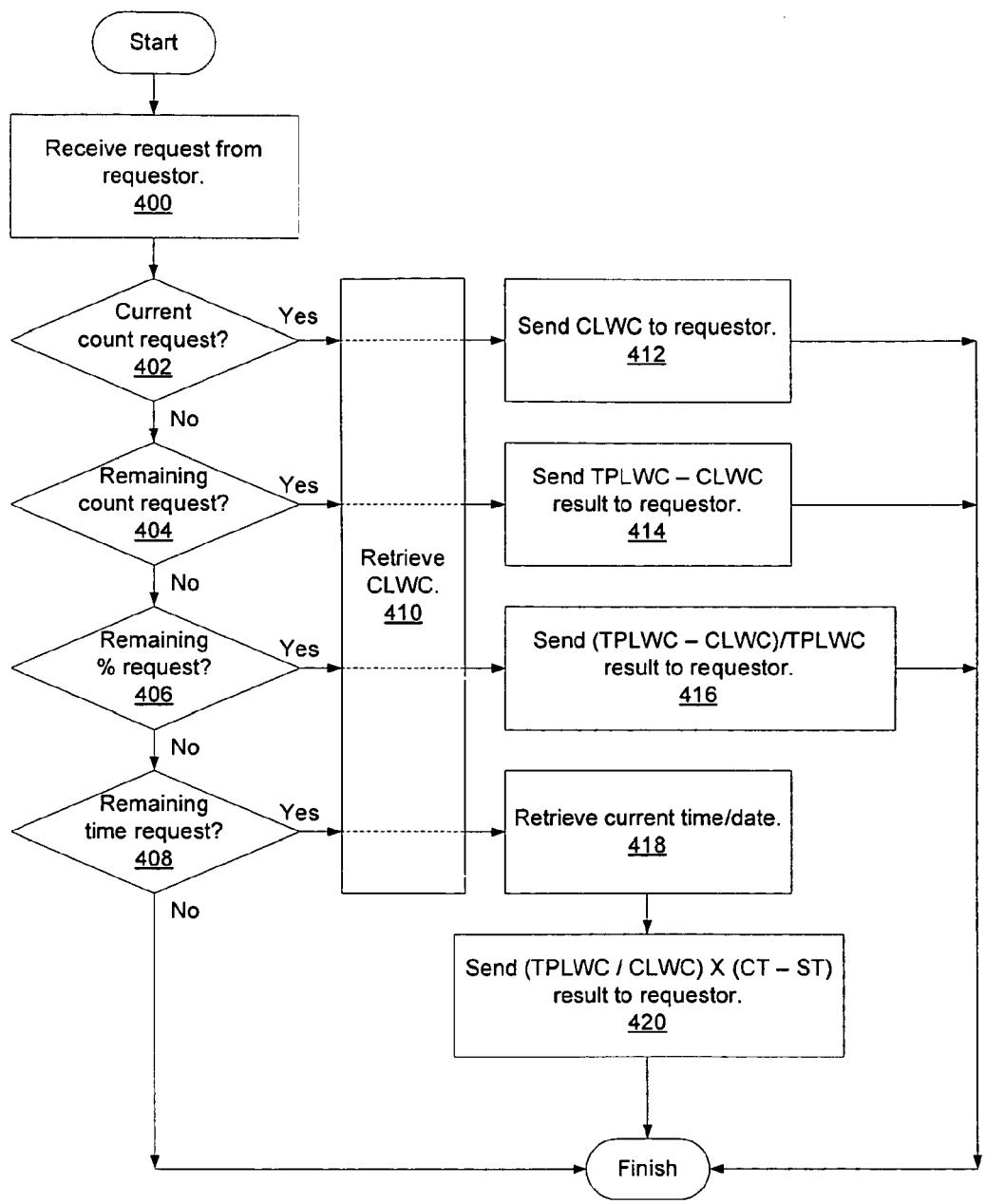
FIG. 4 is a flow diagram of an embodiment of a process to send NVM storage lifetime write information to a requestor.

FIG. 4 is a flow diagram of an embodiment of a process to send NVM storage lifetime write information to a requestor.

The process may be performed by hardware, software, or a combination of both. The process begins by processing logic receiving a request from a requestor (processing block 400). Then processing logic goes through a series of checks to determine what type of request has been received. Processing logic checks to see if the request is a current count request (processing block 402), a remaining count request (processing block 404), a remaining percentage request (processing block 406), or a remaining time request (processing block 408). In many embodiments, additional types of requests not shown in FIG. 4 might also be received and serviced.

Returning to processing block 402, if the request received is a current lifetime write count (CLWC) request, processing logic then may retrieve the CLWC (processing block 410). In different embodiments, the lifetime write count retrieved may or may not be limited to host writes. Then the retrieved CLWC is sent to the requestor (processing block 412) and the process is complete.

If the requestor is requesting a remaining count, then processing logic retrieves the CLWC (processing block 410). Then processing logic subtracts the CLWC from the total predicted lifetime write count (TPLWC) and sends the result to the requestor (processing block 414).

If the requestor is requesting a remaining percentage of writes (based on the current count of writes versus the total predicted lifetime writes) then processing logic would retrieve the CLWC (processing block 410). Next, processing logic would subtract the CLWC from the TPLWC and divide the result by the TPLWC to obtain the remaining percentage of writes left when viewed against the total predicted lifetime write count. This result may be sent to the requestor (processing block 416).

Otherwise, if the requestor requests a predicted remaining amount of time left for the NVM array (processing block 408), then processing logic retrieves the CLWC (processing block 410). Then processing logic may retrieve the current time and date (CT) (processing block 418). Then with the assumption that a start time and date (ST) were recorded at the inception of the lifetime of work of the NVM storage array, a remaining time left in the lifespan of the NVM storage array may be predicted based on the following calculation:

$$\text{Predicted\_Remaining\_Lifespan} = \frac{TPLWC}{CLWC}(CT - ST)$$

The result (predicted remaining lifespan in time of the device) may be sent to the requestor (processing logic 420).

As mentioned, there may be many other potential calculations whose results may be requested by a requestor. The CLWC, the TPLWC, the CT, the ST, and possibly additional data may be used in many ways calculate the lifetime wear of a NVM storage array. In other embodiments, the writes may be distinguished on a NVM device by device basis instead of across the entire NVM storage array as one entity.

Thus, embodiments of a method, device, and system, to maintain a lifetime count of write operations to a non-volatile memory storage array are described. These embodiments have been described with reference to specific exemplary embodiments thereof. It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

We claim:

1. A method, comprising:
    incrementing a count of total lifetime write operations to a non-volatile memory storage for each of one or more write operations to the non-volatile memory storage;
    receiving a request for the count of total lifetime write operations from a requestor;
    sending the count of total lifetime write operations to the requestor;
    maintaining a wear threshold write count; and
    modifying policies for continued use of the non-volatile memory storage when the count of total lifetime write operations surpasses the wear threshold write count, the policies including wear-leveling, write throttling, and refresh cycle rates.

2. The method of claim 1, further comprising:
    while the non-volatile memory storage is operational, storing the count of total lifetime write operations in a volatile memory storage.

3. The method of claim 2, further comprising:
    copying the count of total lifetime write operations into the non-volatile memory storage from the volatile memory storage prior to a pending power down or reset of the non-volatile memory storage or during a backup procedure of the count of total lifetime write operations.

4. The method of claim 3, further comprising:
    after a reset of the non-volatile memory storage, copying the count of total lifetime write operations into the volatile memory storage from the non-volatile memory storage.

5. The method of claim 1, further comprising:
    sending, to the requestor, a predicted amount of time remaining prior to when the non-volatile memory storage becomes unreliable.

6. The method of claim 1, wherein the non-volatile memory storage includes one or more NAND devices or one or more phase change memory (PCM) devices.

7. The method of claim 1, wherein the count of total lifetime write operations includes a total number of host writes and a total number of non-host writes to the non-volatile memory storage.

8. The method of claim 7, wherein the non-host writes include writes initiated from a controller coupled to the non-volatile memory storage for desegmentation purposes.

9. A device, comprising:
    a non-volatile memory storage; and
    a storage controller to increment a count of total lifetime write operations to the non-volatile memory storage for each write operation to the non-volatile memory storage;
    receive a request for the count of total lifetime write operations from a requestor;
    send the count of total lifetime write operations to the requestor;
    maintain a wear write count threshold value; and
    modify policies for continued use of the non-volatile memory storage when the count of total lifetime write operations surpasses the wear write count threshold value, the policies to include wear-leveling, write throttling, and refresh cycle rates.

10. The device of claim 9, wherein the storage controller is further operable to:
    while the non-volatile memory storage is operational, store the count of total lifetime write operations in a volatile memory storage.

11. The device of claim 10, wherein the storage controller is further operable to:
    copy the count of total lifetime write operations into the non-volatile memory storage from the volatile memory storage prior to a pending power down or reset of the non-volatile memory storage or during a backup procedure of the count of total lifetime write operations.

12. The device of claim 11, wherein the storage controller is further operable to:
    after a reset of the non-volatile memory storage, copy the count of total lifetime write operations into the volatile memory storage from the non-volatile memory storage.

13. The device of claim 9, wherein the non-volatile memory storage includes one or more NAND devices or one or more phase change memory (PCM) devices.

14. The device of claim 9, wherein the storage controller is further operable to:
    send, to the requestor, a predicted amount of time remaining prior to when the non-volatile memory storage becomes unreliable.

15. The device of claim 9, wherein the count of total lifetime write operations includes a total number of host writes and a total number of non-host writes to the non-volatile memory storage.

16. The device of claim 15, wherein the non-host writes include writes initiated from the storage controller to the non-volatile memory storage for desegmentation purposes.

17. A system, comprising:
    a volatile memory storage;
    a non-volatile memory storage; and
    a storage controller to
        increment a count of total lifetime write operations to the non-volatile memory storage for each write operation to the non-volatile memory storage;
        receive a request for the count of total lifetime write operations from a requestor;
        send the count of total lifetime write operations to the requestor;
        store the count of total lifetime write operations in the volatile memory storage;
        maintain a wear write count threshold value; and
        modify policies for continued use of the non-volatile memory storage when the count of total lifetime write operations surpasses the wear write count threshold value, the policies to include one of wear-leveling, write throttling, and refresh cycle rates.

18. The system of claim 17, wherein the storage controller is further operable to:
copy the count of total lifetime write operations into the non-volatile memory storage from the volatile memory storage prior to a pending power down or reset of the non-volatile memory storage or during a backup procedure of the count of total lifetime write operations.

19. The system of claim 18, wherein the storage controller is further operable to:
after a reset of the non-volatile memory storage, copy the count of total lifetime write operations into the volatile memory storage from the non-volatile memory storage.

20. The system of claim 17, wherein the non-volatile memory storage includes one or more NAND devices or one or more phase change memory (PCM) devices.

21. The system of claim 17, wherein the count of total lifetime write operations includes a total number of host writes and a total number of non-host writes to the NAND memory storage.

22. The system of claim 21, wherein the non-host writes include writes initiated from the storage controller to the NAND memory storage for desegmentation purposes.

* * * * *